United States Patent [19]

Stevens

[11] 4,297,635
[45] Oct. 27, 1981

[54] WATTHOUR METER AND BATTERY RETAINING APPARATUS THEREFOR

[75] Inventor: Francis J. Stevens, North Berwick, Me.

[73] Assignee: General Electric Company, Somersworth, N.H.

[21] Appl. No.: 95,163

[22] Filed: Nov. 19, 1979

[51] Int. Cl.³ .............. G01R 1/04; G01R 11/04; H01R 13/48; H01M 2/10
[52] U.S. Cl. .............................. 324/156; 324/116; 324/149; 339/152; 339/258 F; 429/100
[58] Field of Search ............. 324/53, 51, 149, 137, 324/156, 116, 157, 74, 426; 339/252 F, 253 F, 258 R, 258 F, 259 R, 259 F, 262 F, 152; 429/96–100; 362/202, 362-371, 171, 178; 361/364, 372–375

[56] References Cited

U.S. PATENT DOCUMENTS

| | | | |
|---|---|---|---|
| 2,154,653 | 4/1939 | Anketell | 429/97 |
| 2,205,316 | 6/1940 | Stratton | 324/51 |
| 2,397,469 | 4/1946 | Casanov | 429/100 X |
| 2,449,550 | 9/1948 | Eichberg et al. | 339/152 X |
| 3,088,992 | 5/1963 | Lyman | 429/100 |
| 3,181,974 | 5/1965 | Barbera | 339/152 X |
| 4,075,561 | 2/1978 | Stevens | 324/156 X |

Primary Examiner—Gerard R. Strecker
Attorney, Agent, or Firm—Robert E. Brunson

[57] ABSTRACT

An apparatus for retaining a replaceable battery comprised of a unitary structure having a chamber therein for receiving a battery and a resilient retaining means cooperating in the chamber with the battery provides a structure for easily replacing a battery. The apparatus is particularly adaptable to a programmable electrical watthour meter where a battery and programming connector in the watthour meter must be accessed through an access port in a housing of the watthour meter to replace the battery and service the watthour meter.

17 Claims, 7 Drawing Figures

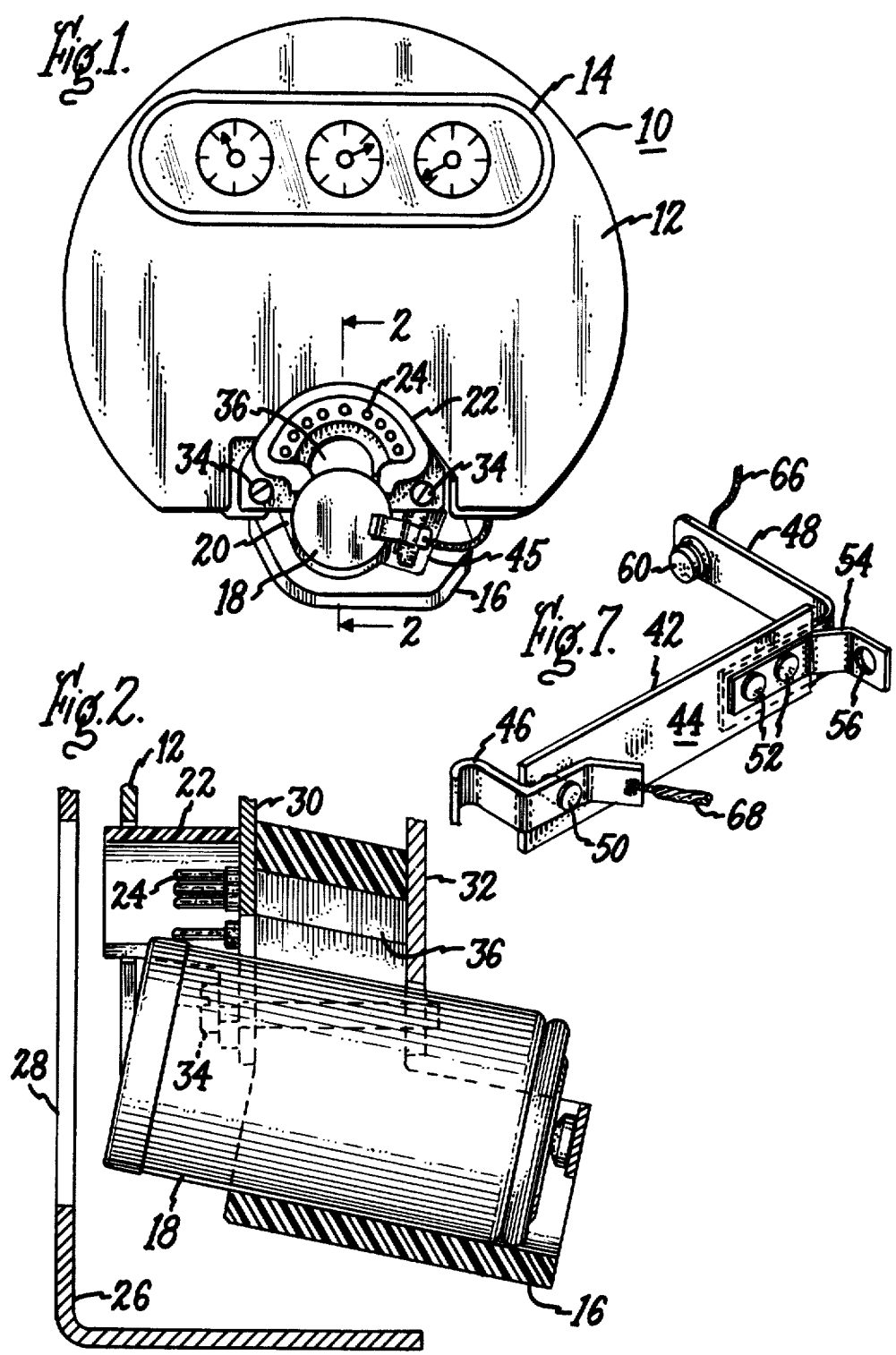

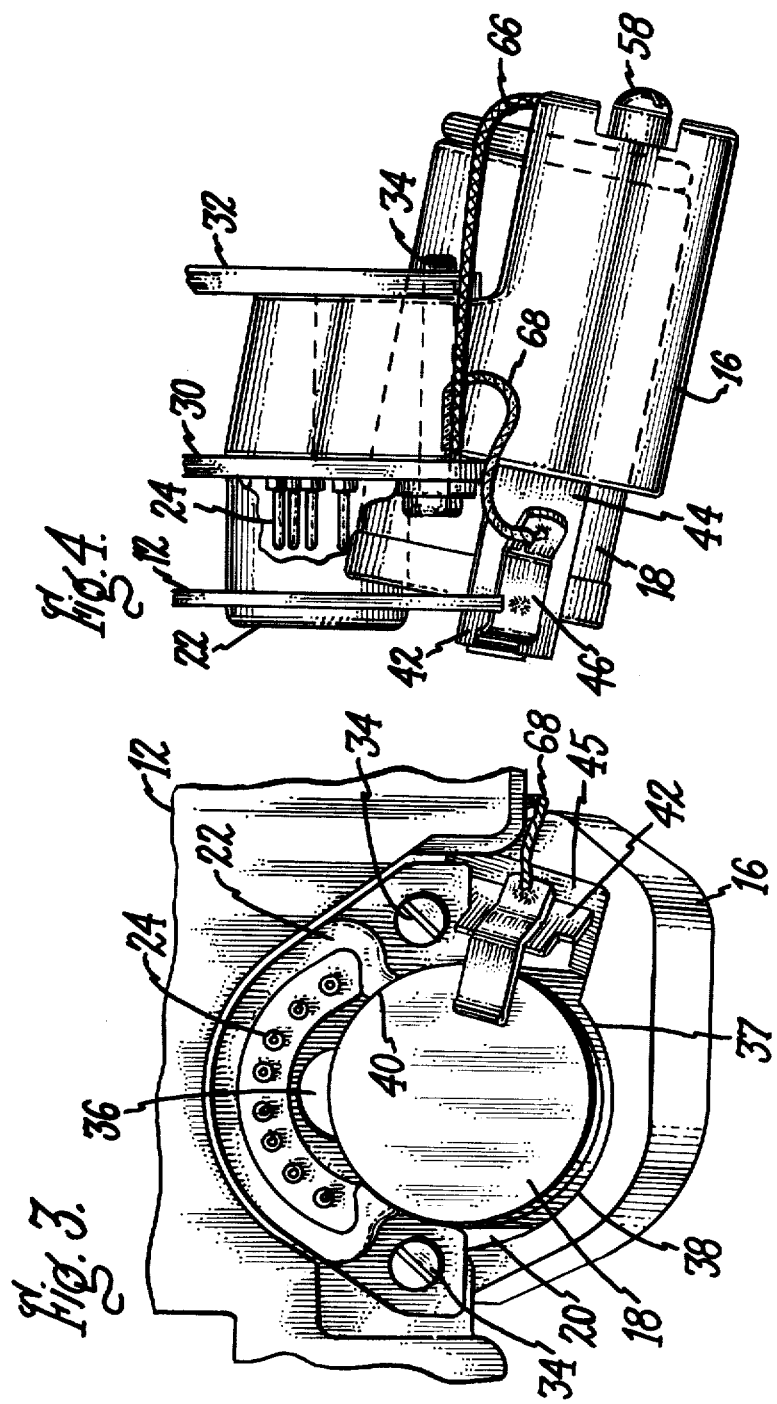

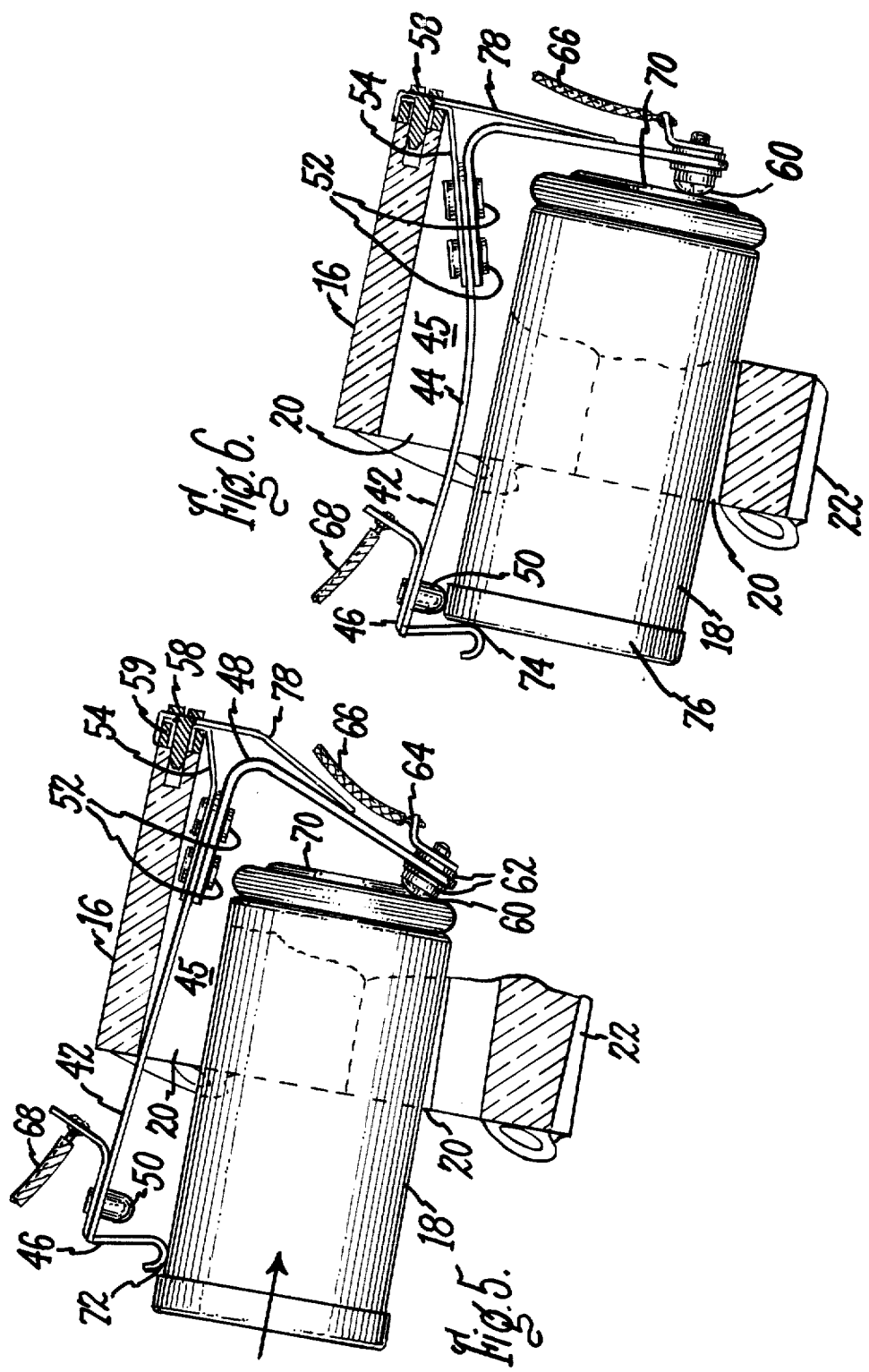

WATTHOUR METER AND BATTERY RETAINING APPARATUS THEREFOR

BACKGROUND OF THE INVENTION

This invention relates generally to apparatus for retaining a replaceable battery and more particularly to a universally adaptable battery retaining device for use in electrical and electronic apparatus such as, programmable watthour meters, micro-processors, portable electronic test equipment and the like.

One sophisticated electronic apparatus of the above type, in which the present invention finds particular use, is in a multiple rate electrical watthour meter of the type disclosed in U.S. Pat. No. 4,050,020 assigned to the same assignee of the present invention. In these types of watthour meters, electronic circuits are employed where batteries are required for temporary or emergency operation during utility power outages.

In watthour meters of the type disclosed in U.S. Pat. No. 4,050,020, the battery is accessed for replacement through an access port in the cover of the meter. Since this access port is relatively small, and further since the battery is not easily accessible through the port, a battery holder or retaining device is desirable which makes battery replacement easy.

One prior art battery retaining apparatus, assigned to the same assignee of the present invention, for use in watthour meters of the above type is disclosed in U.S. Pat. No. 4,075,561, entitled Programmable Electrical Apparatus Containing a Battery. The battery in this patent is specially constructed with a terminal post on one end of the battery extending toward the outer periphery of the battery. When the battery is inserted in a chamber of a holder, the battery must be rotated to lock the terminal post under a connecting terminal on the holder. This rotating action, particularly when the battery is being accessed through a meter port, is difficult to perform without a special tool for grasping and rotating the battery.

Additionally, the specially constructed battery, as disclosed in U.S. Pat. No. 4,075,561, is more expensive than a conventional dry cell battery. While the battery holder disclosed in this patent functions well in its environment, it has since been found desirable to provide a new and improved retaining apparatus which can be more economically manufactured, and which makes use of a conventional battery of lower cost. To that end, the present invention is an improvement over the invention of U.S. Pat. No. 4,075,561.

SUMMARY OF THE INVENTION

The present invention, in its broadest context, comprises a new and advantageous universally adaptable apparatus for retaining a replaceable battery of conventional construction. The invention comprises a unitary structure with a chamber for receiving a battery. A resilient retaining means having electrical contacts or lips on an elongated member cooperate in the chamber of the unitary structure with the battery to automatically lock the battery into place in the chamber when the battery is inserted into the chamber. No actions are required, such as turning or twisting the battery, other than pushing the battery directly into the chamber.

The invention is particularly directed to and useful in electrical apparatus such as electronically programmable watthour meters. These types of meters are serviced at times by utility personnel at the customer residence. This service, generally, requires either reprogramming, testing a program, or replacement of the back-up power cell or battery. As such, the present invention, further contemplates a new and improved electrical terminal connector and guide means for receiving a programming probe through the same meter cover access port for servicing the battery.

OBJECTS OF THE INVENTION

In view of the preceding, it is therefore a primary object of the present invention to provide an apparatus for retaining a replaceable battery having enhanced operating characteristics.

It is also an object of the present invention to provide an improved electrical apparatus housed in a cover containing a replaceable battery and internally programmable connecting means accessible through a single access port in the cover for replacing the battery for servicing, programming, or testing the electrical apparatus.

It is a further object of this invention to provide an enclosed electrical apparatus of a unique construction comprising a unitary structure having a chamber and battery retaining means in combination with an electrical terminal connector positioned approximately concentrically with and within the inner circumferential area of the periphery of an access port in the enclosure of the apparatus, whereby replacement of the battery and/or electrical programming or testing of the electrical apparatus can be carried out through a single access port or service entry.

It is an additional object of this invention to provide an apparatus for retaining a battery within the enclosure of a watthour meter having an electronic circuit board receiving power from a battery retaining and contact means in the apparatus.

BRIEF DESCRIPTION OF THE DRAWING

Other objects, features and advantages of the present invention will become more fully apparent from the following detailed description of the preferred embodiment, the appended claims and the accompanying drawing in which:

FIG. 1 is a front view of a portion of an electrical apparatus, such as a watthour meter;

FIG. 2 is a side view of a portion of the apparatus of FIG. 1, with a part thereof in cross-section taken along lines 2—2 of FIG. 1 and illustrates the construction of the invention;

FIG. 3 is an enlarged front view of a battery retaining apparatus and programmable connecting means taken from a portion of FIG. 1 showing in greater detail the construction of the invention;

FIG. 4 is a non-cutaway side view of the apparatus of FIGS. 1 and 2 illustrating the construction of the invention;

FIGS. 5 and 6 are cutaway side views of the apparatus of the present invention illustrating the co-operating relationship between the retaining means of FIG. 7 and a battery while being inserted into and locked in place in the apparatus; and FIG. 7 is a detailed perspective view showing the construction of a resilient retaining means or latch for retaining a battery in the apparatus of FIGS. 1 and 2 in accordance with invention.

DESCRIPTION OF THE PREFERRED EMBODIMENT

Referring initially to the drawing, reference is first made to FIG. 1, wherein there is illustrated an electrical apparatus 10, such as a watthour meter for measuring and recording the consumption of electrical power. The front view of the meter 10 contains a conventional meter register front plate 12 having a plurality of meter dials 14 for displaying the amount of electrical energy consumed by the meter. The apparatus 10 also comprises a unitary structure 16 for retaining a replaceable battery or cell 18 in a chamber 20 of the unitary structure 16. Also complimenting the design of the unitary structure 16 is a probe guide or receptacle 22 for receiving a programming probe externally inserted into the meter apparatus 10 in a manner to subsequently be described. Also as shown in FIG. 1, the probe guide 22 at least partially surrounds a plurality of electrical terminals or connecting pins 24 suitably positioned to come into corresponding contact with the aforementioned programming probe when the probe is inserted into the guide 22.

In the illustrated embodiment of the invention, the meter apparatus 10 is enclosed in a protective housing or cover 26 as best illustrated in the cross sectional view of FIG. 2 taken along lines 2—2 of FIG. 1. As shown in FIG. 2, the housing 26 contains an access port or entry 28 which is aptly located in the cover housing in alignment with the unitary structure 16 and the probe guide 22. This alignment is to allow access to the interior mechanism or components of the apparatus 10 in order to perform required periodic routine servicing of the apparatus such as replacement of the battery, programming of the meter apparatus 10, or testing and calibration. One such type meter utilizing a replaceable battery and which is further programmable through an access port such as shown in FIG. 2 is disclosed in the aforementioned U.S. Pat. No. 4,050,020, entitled "Multiple Rate Electrical Energy Metering System and Method" assigned to the assignee of the present invention. Also, a meter cover or housing having an access port and key lock mechanism suitable for use with the present invention is disclosed in U.S. patent application Ser. No. 914,218 filed June 9, 1978, now U.S. Pat. No. 4,188,575 entitled "Key Operated Meter Access Lock and Reset Mechanism" assigned to the assignee of the present invention. In this application, a key operated access hatch may be opened to allow access through the port 28 for entry to the inside of the apparatus 10 to service the meter by replacement of the battery 18 or to program the meter by the insertion of the aforementioned probe into the probe receptacle 22.

In the cross sectional view of FIG. 2, the unitary structure 16 is shown as being substantially L shaped and secured to the meter apparatus 10 between a circuit board 30 and a suitable metal frame or member 32 in the meter. The unitary structure 16 and the probe guide 22 may be secured to the meter by either staking, or as shown in the preferred embodiment, by two screws 34. As shown, the screws 34 serve to secure the probe guide 22 and the unitary structure 16 in nesting relationship with the circuit board 30 by passing the screws through suitable apertures in the probe guide unitary structure, the circuit board, and into a threaded portion of the supporting or mounting member 32. Thus, by pulling the screws down securely, the entire apparatus of the invention is secured to the meter providing a composite structure for the retainment of the battery 18 and also for integrally holding the probe guide in proper alignment or registration with the access port 28.

It should also be noted in FIG. 2, that the terminal connectors or pins 24 are an integral part of the circuit board 30. In the aforementioned U.S. Pat. No. 4,075,561, the terminal connectors 24 are disclosed as an integral part of the apparatus for containing the battery. In the arrangement of the battery retaining apparatus in that patent, it was necessary to individually wire each of the receptacle pins into suitable connectors on the circuit board. In the present invention, however, economy is achieved by actually making the receptacle pins and their connections a part of the circuit board. This is done by mounting the pins on the board and making the necessary wiring connections to the circuitry on the board using conventional printed circuit flow solder techniques. It should also be noted, as more clearly shown in FIG. 1, that the probe guide 22 contains a suitable aperture or semi circular opening 36 to allow the insertion of a tool, such as a screw driver, into the meter through the access opening 28 to make calibration adjustments by adjusting screws or potentiometers not shown in the drawing.

Referring to FIG. 3, there is shown an exploded view of the battery retaining apparatus of FIG. 1 illustrating in greater detail the inter relationships between the various components of the apparatus. It will be noted, that the chamber 20 is substantially circular in shape and suitably sized to receive the battery 18. The wall of the chamber at 37 is formed by semi circular portions 38 and 40 of the unitary structure 16 and the probe guide 22 respectively. Thus, it can be seen that the composite structure comprised of elements 16 and 22 provides a suitable chamber 20 for nesting the battery 18 when it is inserted into the chamber.

In FIG. 3, the battery 18 is shown fully installed in the battery retaining apparatus where it is held in place by a resilient retaining or locking means 42. As more clearly shown in this figure, the retaining means 42 is mounted in a channel 45 forming a part of the wall 37 or chamber 20 of the unitary structure 16. The construction of the retaining means 42 is best shown in FIG. 7.

The retaining means 42 is comprised of an elongated resilient or flexible member 44 formed of a suitable spring material such as spring steel, or other suitable spring type materials such as PVC plastics having memory, which when distorted or bent will spring back to their original shape. Formed on opposite ends of the member 44 are two hooks or lips 46 and 48 for contacting opposite ends of the battery 18. The lips 46 and 48 are formed at predetermined angles with respect to the member 44. As best illustrated in FIG. 5, each of the lips 46 and 48 is preferably at some acute angle less than 90°, it having been found that a suitable angle for each of the lips being approximately 70° to 80°.

The entire structure of the retaining means 42, including the lips 46, 48 and member 44, may be formed out of the same material as one integral unit. However in the preferred embodiment as shown in FIGS. 5 and 7, the lips 46 and 48 are preferably formed of a stiffer or more rigid material that the elongated resilient member 44, and preferably of a substantially larger cross sectional area than member 44. By so constructing the lips 46 and 48 of a stiffer material than member 44, the member 44 is made to more easily flex or bend when being utilized in the present invention. Each of the lips 46 and 48 is attached at the respective ends of the member 44 by suitable means such as by staking. As shown, lip 46 is attached to its end of member 44 by a top contact 50, preferably of highly conductive material such as gold, in conventional staked or riveted fashion. In a similar fashion, lip 48 is secured to the bottom of member 44 by two staking members or rivets 52.

It will also be noted (FIGS. 5 and 6) that a mounting means or member 54, for mounting the resilient retaining means 42 to the structure 16, is staked to the bottom end of the elongated member 44. The mounting member 54 has an aperture 56 formed in its free end for receiving a screw 58 or rivet for suitably attaching the resilient retaining means 42 to the bottom outside wall of the unitary structure as shown by FIG. 5. In the preferred embodiment, the outside wall of structure 16 at 59 is threaded to receive the screw 58 so that the resilient member 44 may readily be assembled during manufacture or easily replaced for maintenance purposes if necessary.

Referring back to FIG. 7, it will be noted that the lip 48 also contains a bottom terminal or contact 60 for contacting the bottom end, or one of the terminals of the battery 18, when the battery is inserted into the battery retaining apparatus of the present invention. The manner of assembling the terminal 60 to lip 48 is illustrated in FIG. 5, wherein the terminal 60 is staked to the end of lip 48 with an insulating bushing or washer 62 on each side of the lip 48 to insulate the terminal so that it is not in electrical contact with the metallic structure of the retaining means 42. Also, staked to the terminal 60 is a terminal lead connecting means 64 for soldering or otherwise connecting a conductor 66 to the terminal 60. It will also be noted, that a second conductor 60 may be soldered or otherwise connected to a suitable connecting means on the upper contact 50 or lip 46 as shown in FIGS. 5 and 7.

Referring to FIG. 4, it can be seen that the conductors 66 and 68 are connected to suitable circuitry on the circuit board 30 to complete an electrical circuit for providing power to circuits on the board. In the embodiment disclosed, whenever a utility company's power goes out, auxiliary power is provided by the battery to suitable circuitry on the board 30 via conductors 66 and 68.

To understand the operation of the invention, reference is now made to FIGS. 5 and 6. In FIG. 5, the battery 18 is shown as it is first inserted into the chamber 20 of the unitary structure 16. When the battery is first inserted through the access port 28 into the chamber 20 (see FIG. 2), the bottom end or positive terminal of the battery, such as at 70, first contacts the terminal 60. Also, as shown in FIG. 5, the top terminal or hooked end of the lip 46 rides very lightly on the side of the battery as shown at 72. As the battery is pushed further inward, as shown in the direction of the arrow of FIG. 5, the resilient elongated member 44 begins to bend due to concurrent and 90° opposing forces applied from the contact of terminal 60 with the bottom of the battery, and the lip 46 bearing against the top side end of the battery as at 72. As shown in FIG. 6, when the battery is inserted far enough into the chamber 20, the lip 46 snaps up over the top end or negative terminal of the battery making contact with the battery as shown at 74.

It should also be noted that the terminal 50 contacts the top end of the battery. While the contact 50 is not an essential part of the invention, it is utilized in the preferred embodiment to insure that adequate contact is also made with the battery by the retaining means 42. In the preferred embodiment, the battery 18 has a rim portion 76 formed on one end, preferably the negative terminal end, which allows dual contact of the terminal 50 and the lip 46 with the negative terminal of the battery. The purpose of having the dual contact is to eliminate the possibility of intermittent loss of power to the circuitry on circuit board 30 during handling or installation of the meter apparatus 10 of the present invention. It has been found in past structures, such as that disclosed in the aforementioned U.S. Pat. No. 4,075,561, that that structure did not accommodate all of the shock and vibration problems encountered when meter personnel would jolt a meter. As a result, an intermittent loss of power, due to a bouncing contact on the battery, would cause loss of power to the circuit board and thus the possible loss of memory stored in micro-circuits or micro-processor memories on that board. The present invention alleviates that possibility. As can be seen in FIG. 6, should the meter be dropped or vibrated, whereby a latteral shock is presented to the battery, the lip at point 74 will always remain in contact at the bottom end of the battery by brushing back and forth across the end of the battery. Likewise, should a vertical shock be applied to the retaining mechanism of the present invention, the contact 50 will ride up and down on the rim portion 76, thus continuously maintaining electrical contact with the battery. There is no problem with the bottom contact 60 being jolted away from the bottom end of the battery 70 during these shocking operations. This is due to the fact that the terminal 60 rides substantially in the center of the bottom terminal 70.

While not an essential part of the invention, a spring 78, formed as shown in FIGS. 5 and 6, may be attached under the screw 58. The spring is preferably of spring steel similar to the member 42 and bent at some predetermined obtuse angle, whereby the unattached end of the spring 78 frictionally engages the bottom side of the lip 48.

The purpose of spring 78 is to provide upward pressure on the bottom lip 48. This upward pressure causes the resilient member 42 to be cantilevered toward the outer wall of the chamber 20 when the battery is out of the chamber. By so cantilevering the lip 46 toward the outer wall, sufficient clearance is provided to allow the battery 18 to be easily inserted into the chamber.

Having described the construction of the invention in an apparatus such as a watthour meter, it can be seen that the invention enables an operator to perform all routine service including replacement of batteries or electrical programming or testing and adjustment of the apparatus with an external instrument or tools inserted through a single access port or entry. For example, the concentrically aligned arrangement of the internal components 16, 22 and 24, as best shown in FIGS. 1 and 2, within a circumferential area smaller than the periphery of the access port or service entry 28 permits a service operator to remove exhausted batteries and install replacement batteries through the same access port which is used for the introduction of an adjusting tool or an external programming probe for making electrical connections with the terminal connectors 24 on the board 30. Further, it can be seen that the combination of the unitary structure and the chamber therein for receiving a battery and the resilient retaining means and the contacts thereon provide an economical and efficient apparatus for retaining a replaceable battery in a watthour meter or other electrical device. Further, as best shown in FIG. 6, the battery can easily be removed by the mere insertion of an operator's finger or a suitable instrument to force the lip 46 off of the edge of the battery 18. When the lip 46 is forced off the edge of the battery, the spring pressure of the resilient means 42 and optional spring 78 will cause the battery to snap outward toward the access port with the battery establishing a position substantially as shown in FIG. 5. With the battery in this position, the operator can easily reach in and retrieve the battery.

Although the invention has been described with reference to certain specific embodiments thereof, numerous modifications are possible. It is desired to cover all modifications falling within the spirit and scope of this invention.

What is claimed is:

1. Apparatus for retaining a replaceable battery comprising:
   (a) a unitary structure characterized by a rigid material having first and second oppositely disposed ends and including therein a chamber longitudinally extending between the oppositely disposed ends, said chamber having an opening in at least one of the ends and having a wall for surroundingly supporting a battery to be inserted into the chamber from the open end;
   (b) a retaining means for retaining said battery in the chamber of said unitary structure, said retaining means characterized by an elongated member of resilient spring material, said elongated member having a lip formed on each end thereof, each lip extending substantially perpendicularly in the same direction from said elongated member and at a predetermined angle with respect thereto; and
   (c) means, including said retaining means and said unitary structure, for mounting said retaining means on said unitary structure with a first lip of said retaining means disposed in the chamber at the first end of said unitary structure and a second lip of said retaining means disposed in the chamber at the second end of said unitary structure, one of the lips of said retaining means providing sufficient clearance in the chamber opening to allow said battery to be inserted into the chamber, whereby, when said battery is being inserted into the chamber, one of the first and second lips contacts one terminal end of said battery, while the other lip slidingly engages the outside surface of said battery creating concurrent and opposing forces at opposite ends of said elongated member causing said elongated member to bend and to thereby cause said other lip to slide off of the outside surface of said battery and snap over the other terminal end of said battery, when said battery is fully inserted into the chamber, to thus securely retain said battery in the chamber of said structure.

2. The apparatus in accordance with claim 1, wherein said retaining means further includes an electrical contact on each of said first and second lips which makes electrical contact with the terminal ends of the battery while said battery is retained in the chamber of said unitary structure.

3. The apparatus in accordance with claim 2, wherein said battery has a rim portion as part of the terminal end thereof which comes into contact with the electrical contact on that lip of said retaining means which snaps over the other terminal end of said battery.

4. The apparatus in accordance with claim 2, wherein at least one of the electrical contacts on said first and second lips is electrically insulated from said retaining means.

5. The apparatus in accordance with claim 1, further including a spring member mounted at one end thereof to the end of said unitary structure opposite the chamber opening, the other end of said spring member exerting pressure on said one of said first and second lips to cantilever said elongated member toward the wall of said chamber to thereby move said other lip of said elongated member outward of the chamber, whereby the battery may be easily inserted into the chamber.

6. The apparatus in accordance with claim 1, wherein said retaining means is mounted inside the chamber of said unitary structure and secured at one end thereof to that end of said unitary structure opposite the chamber opening to cause bending of said elongated member due to the concurrent and opposing forces created by the lips bearing against said said battery.

7. The apparatus in accordance with claim 6, wherein the chamber of said unitary structure further includes a channel formed in the wall thereof in which said elongated member is mounted by securing said elongated member in the wall adjacent the channel.

8. In a programmable electrical watthour meter of the type having a replaceable battery serving as a carry-over power source for the watthour meter, the combination comprising:
   (a) a housing for enclosing the watthour meter, said housing having an access port therein for the installation and removal of a replacement battery and the insertion of a probe for programming the watthour meter;
   (b) an electronic circuit board positioned inside the housing of said watthour meter, said electronic circuit board having connecting pins thereon concentrically aligned with the access port of said housing and within a circumferential area smaller than the periphery of the access port, whereby a probe can be inserted through the access port in mating electrical contact with the connecting pins of said electronic circuit board;
   (c) a unitary structure characterized by a rigid material having oppositely disposed ends and including therein a cylindrical chamber, smaller in diameter than the access port in said housing, and longitudinally extending between the oppositely disposed ends, said chamber having an opening in at least one of the ends and having a wall for surroundingly supporting a battery to be inserted into the chamber from the open end, said unitary structure being positioned inside the housing of said watthour meter with the chamber opening concentrically aligned with the access port of said housing, whereby a replacement battery can be inserted into the chamber through the access port, said unitary structure further including, a retaining means for retaining said battery in the chamber of said unitary structure, said retaining means characterized by an elongated member of resilient spring material having a lip formed on each end thereof, each lip extending substantially perpendicularly in the same direction from said elongated number and at a predetermined angle with respect thereto, and each lip including an electrical contact for contacting opposite terminal ends of said battery, said retaining means being mounted on said unitary structure with a first lip of said retaining means disposed in the chamber at one end of said unitary structure and a second lip of said retaining means disposed in the chamber opening at the other end of said unitary structure, the second lip being disposed to provide sufficient clearance in the chamber opening to allow said battery to be inserted into the chamber, whereby, when said battery is being inserted into the chamber, through the access port, the first lip of said retaining means contacts one terminal end of said battery, while the second lip slidingly engages the outside surface of said battery creating concurrent and opposing forces at opposite ends of said elongated member causing said elongated member to bend and to thereby cause the second lip to slide off of the outside surface of said battery and snap over the other terminal end of said battery, when said battery is fully inserted into the chamber, to thus securely retain said battery in the chamber of said unitary structure; and (d) means connecting the electrical contact of each lip of said retaining means to said electronic circuit board for completing an electrical circuit therebetween.

9. The apparatus in accordance with claim 8, further including a spring member mounted at one end thereof to the end of said unitary structure opposite the chamber opening, the other end of said spring member exerting pressure on the first lip to cantilever said elongated member toward the wall of said chamber to thereby move the second lip of said elongated member outward of the chamber, whereby the battery may be easily inserted into the chamber.

10. The apparatus in accordance with claim 8, wherein the battery has a rim portion as a part of the terminal end thereof which comes into contact with the electrical contact on the second lip of said retaining means.

11. The apparatus in accordance with claim 8, wherein at least one of the electrical contacts on said first and second lips is electrically insulated from said retaining means.

12. The programmable electrical watthour meter in accordance with claim 8 further including a probe guide secured to said electronic circuit board and being formed to at least partially surround the connecting pins on said electronic circuit board, said probe guide being concentrically aligned with the access port of said housing for guiding the probe, when inserted through the access port, into electrical contact with the connecting pins on said electronic circuit board.

13. Apparatus for retaining a replaceable battery comprising:

(a) a unitary structure characterized by a rigid material having first and second oppositely disposed ends and including an open-ended cylindrical chamber longitudinally extending through the structure between the ends, said chamber having a wall for surroundingly supporting a battery to be inserted into the chamber from one of the open ends, and further having a channel in the wall and extending longitudinally with the chamber between the ends of said unitary structure; and (b) a retaining means for retaining said battery in the chamber of said unitary structure, said retaining means being characterized by and including, (1) an elongated member of resilient spring material, said elongated member having first and second lips of substantially rigid material, with a lip being formed on each end of said elongated member, each lip extending substantially perpendicularly in the same direction from said elongated member and at a predetermined angle with respect thereto, and (2) means on the first lip end of said elongated member for mounting said retaining means on the first end of said unitary structure, said elongated member being longitudinally disposed in the channel in the chamber wall with the first lip of said retaining means disposed in the chamber at the first end of said unitary structure and the second lip of said retaining means disposed in the chamber at the second end of said unitary structure, the second lip of said retaining means providing sufficient clearance in the chamber opening to allow said battery to be inserted into the chamber at the second end of said unitary structure, whereby, when said battery is being inserted into the chamber, the first lip of said retaining means contacts one terminal end of said battery, while the second lip of said retaining means slidingly engages the outside surface of said battery creating concurrent and opposing forces at opposite ends of said elongated member causing said elongated member to bend longitudinally in the channel and to thereby cause the second lip of said retaining means to slide off of the outside surface of said battery and snap over the other terminal end of said battery, when said battery is fully inserted into the chamber, to thus securely retain the battery in the chamber of said unitary structure.

14. The apparatus in accordance with claim 13, further including a spring member mounted at one end thereof to the first end of said unitary structure, the other end of said spring member exerting pressure on the first lip to cantilever said elongated member into said channel to thereby move the second lip of said elongated member outward of the chamber, whereby the battery may be easily inserted into the chamber.

15. The apparatus in accordance with claim 13, wherein said retaining means further includes an electrical contact on each of said first and second lips which makes electrical contact with the terminal ends of the battery while said battery is retained in the chamber of said unitary structure.

16. The apparatus in accordance with claim 15, whereby said battery has a rim portion as a part of the terminal end thereof which comes into contact with the electrical contact on the second lip of said retaining means.

17. The apparatus in accordance with claim 15, wherein at least one of the electrical contacts on said first and second lips is electrically insulated from said retaining means.

* * * * *